United States Patent
Schnell

[19]

[11] Patent Number: 6,137,327
[45] Date of Patent: Oct. 24, 2000

[54] DELAY LOCK LOOP

[75] Inventor: Josef Schnell, Burlington, Vt.

[73] Assignee: Siemens Aktiengesellschaft, Munich, Germany

[21] Appl. No.: 09/200,338

[22] Filed: Nov. 25, 1998

[51] Int. Cl.[7] ...................................................... H03L 7/06
[52] U.S. Cl. .......................................... 327/158; 327/149
[58] Field of Search .................................... 327/158, 148, 327/149, 157, 276, 261, 237

[56] References Cited

U.S. PATENT DOCUMENTS 5,355,037  10/1994  Andresen et al. ....................... 327/158
5,663,665   9/1997  Wang et al. ............................. 327/158

Primary Examiner—Dinh T. Le
Attorney, Agent, or Firm—Donald B. Paschburg

[57] ABSTRACT

A delay lock loop circuit, in accordance with the present invention, includes a receiver for receiving a system clock signal and outputting a first clock signal derived from the system clock signal, a delay lock loop for receiving the first clock signal, the first clock signal for synchronizing the delay lock loop and a phase detector and an off chip driver circuit for receiving the first clock signal and outputting data in accordance with a second clock signal derived from the first clock signal. A feedback loop is provided coupling the off driver circuit to the phase detector. The feedback loop includes an on chip delay circuit for modeling on chip delay and a package delay circuit for modeling chip package delay. The feedback loop provides synchronization between the system clock signal and the data output from the off chip driver circuit.

29 Claims, 5 Drawing Sheets

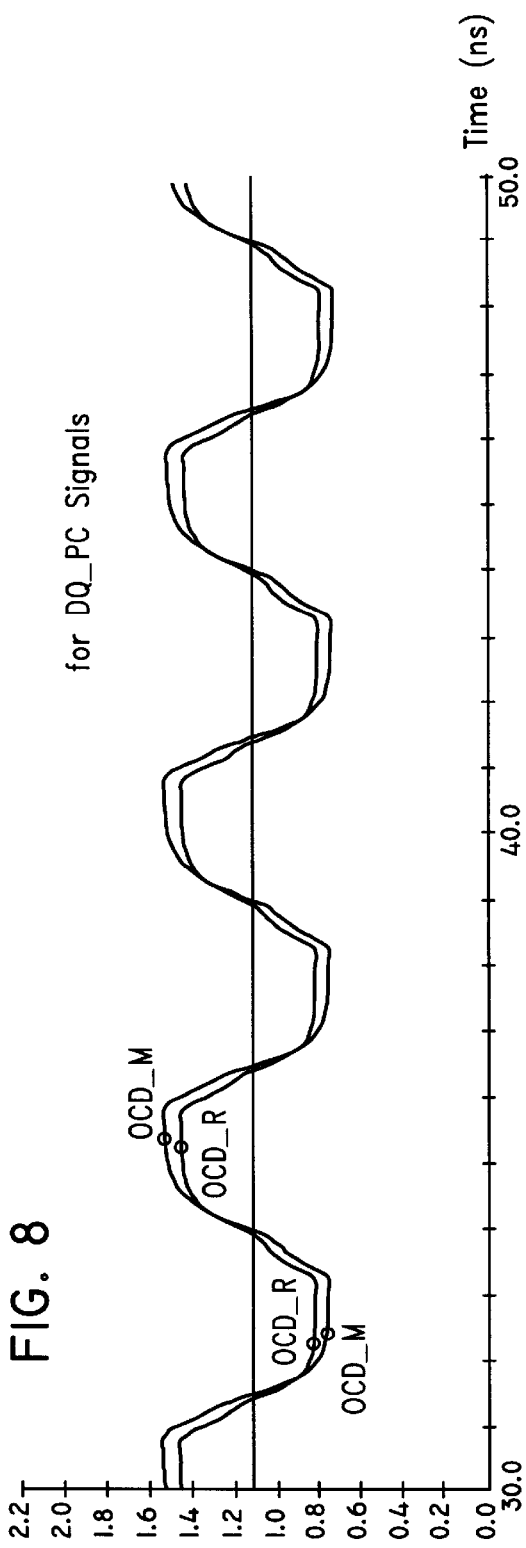
FIG. 8 for DQ_PC Signals
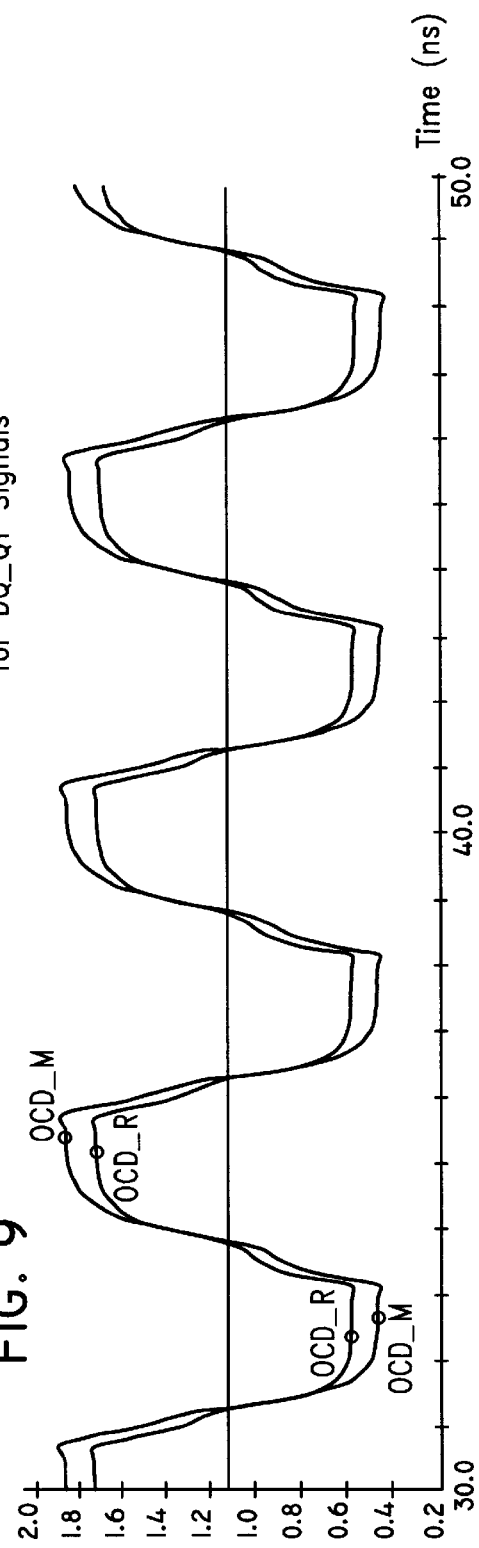
FIG. 9 for DQ_QT Signals

DELAY LOCK LOOP

BACKGROUND

1. Technical Field

This disclosure relates to semiconductor memories and more particularly, to an improved delay lock loop including feedback for synchronizing a system clock with data output lines.

2. Description of the Related Art

Semiconductor memories, such as synchronous dynamic random access memories (SDRAMs) and specific Double Data Rate (DDR) memories, typically include delay lock loops (DLLs). DLLs function to cancel on-chip amplification and buffering delays, and DLLs improve input/output timing margins. DDR SDRAMs are designed such that READ/WRITE data on output lines (DQ pins) are synchronized to a system clock, for example VCLK.

On-chip delay is conventionally "modeled" in a DLL feedback loop to match the delay of "real" circuit components such as, a receiver, a driver, an off chip driver (OCD) and packaging of the chip. Conventional memory chips employing the "modeled" delay often use an inverter chain or similar techniques to account for delays. The accuracy of the matched delay is an important parameter in phase alignment between an incoming clock signal, VCLK, and DQs. Conventional techniques such as those described stiffer from mismatches from the "real" circuit delay in terms of technology variation and temperature behavior. Further, conventional techniques poorly match the packaging delay components caused by bondwire, lead inductance and capacitance together with the module/board level interface (e.g., Stub Series Terminated Logic (SSTL)).

Referring to FIGS. 1 and 2, a conventional DLL scheme is shown. DQ/QS (data output pads for the chip) to system clock synchronization is shown in terms of block diagrams. A desired timing budget is illustrated in FIG. 3. The clock path is split between a chip level (FIG. 1) and a packaging and/or module/board level (FIG. 2) including the interface, for example, an SSTL interface. The clock delay path includes the following:

1. At the chip level (FIG. 1), the incoming differential clock (vclk, vbclk) at a pad on chip V_PC is amplified through a receiver RCV to a refclk signal (REFCLK) and further delayed in a DLL (DLLCLK) and redriven at a driver DRV to control an off chip driver circuit (OCD) and DQ pad (DQ/QS) on a chip DQ-PC.

2. At the packaging and module/board (interface) level (FIG. 2), from chip pad DQ_PC on, the delay path includes a bondwire (BW) and leadframe (lead) inductance delay, $L_{BW+Lead}$, to a DQ-Pin of a module DQP with the interface SSTL including Rstub (stub resistance at the board level, which may be about 25 Ω) and Rterm (termination resistance on the board level), TL (transmission line impedance, which may $Z_o$ about 50 Ω) and CL for the capacitive load. VTT or $V_{term}$ is the termination voltage. If synchronized the system clock vclk/bclk is aligned with DQ/QS signal on pin DQP as shown at line A in the timing diagram of FIG. 3.

Referring to FIG. 4, a block diagram of a conventional DLL circuit with receiver RCV and off chip driver OCD mimic circuits in block 30. Other components include a delay line including delay line elements in block 32, a phase detector (PD), a delay control (DL control), a filter 33 and a modeled delay feedback loop 34. The input reference clock (REFCLK) drives the delay line 32 of the DLL and the output (DLLCLK) is feedback (feedback clock—FB_CLK) through the RC-delay-mimic feedback circuit in block 30 to phase detector PD. The output of phase detector PD goes to the filter 33 which includes logic circuitry to provide an increase (inc) and decrease (dec) signals of the filter. The inc and dec signals of the filter control the delay line 32 and adjust the variable delay between REFCLK and DLLCLK so that REFCLK and FB_CLK are synchronized/aligned.

The RC-delay-mimic circuits mimic the delay of receiver RCV, driver DRV, OCD, and package P (See FIGS. 1 and 2) delays. The RC-delay-mimic circuits usually include an inverter chain to match the delay of the "real" circuits. As described above, one of the disadvantages of this technique is that the inverter circuits do not totally match the "real" circuit delay in terms of technology variation and temperature behavior. In addition, the inverter circuits poorly match the packaging delay components caused by bondwire, lead inductance and capacitance together with the module/board level interface.

Therefore, a need exists for an improved delay lock loop with feedback that more accurately models delays. A further need exists for an improved delay lock loop which avoid deviations in delay due to technology and temperature effects.

SUMMARY OF THE INVENTION

A delay lock loop circuit, in accordance with the present invention, includes a receiver for receiving a system clock signal and outputting a first clock signal derived from the system clock signal, a delay lock loop for receiving the first clock signal, the first clock signal for synchronizing the delay lock loop and a phase detector and an off chip driver circuit for receiving the first clock signal and outputting data in accordance with a second clock signal derived from the first clock signal. A feedback loop is provided coupling the off driver circuit to the phase detector. The feedback loop includes an on chip delay circuit for modeling on chip delay and a package delay circuit for modeling chip package delay. The feedback loop provides synchronization between the system clock signal and the data output from the off chip driver circuit.

In alternate embodiments, the off chip driver circuit preferably includes a plurality of off chip drivers which receive the second clock signal and output data in accordance with the second clock signal. One of the plurality of off chip drivers is preferably coupled to the feedback loop. The one of the plurality of off chip drivers may include transistors, and the transistors may be reduced in size by about 1/50 to conserve power. The on chip delay circuit may include passive RC devices, the passive RC devices having their magnitude increased by about 50 to achieve all appropriate output voltage from the on chip delay circuit. The on chip delay circuit may include an interface logic circuit for outputting a third clock signal which is delayed in accordance with on chip circuitry. The interface logic circuit may include SSTL interface logic. The package delay circuit may output a fourth clock signal which is delayed in accordance with package delays. The package delay circuit may include an inverter chain to provide delay. The feedback loop may include an additional receiver to model the delay of the first receiver. The package delay circuit may include adjustable delay elements wherein adjustment is provided by trimmable fuses to provide an appropriate delay. The trimmable fuses may provide delay adjustment in at least 100 ps increments.

Another delay lock loop circuit, in accordance with the present invention, includes a first receiver for receiving a system clock signal and outputting a first clock signal derived from the system clock signal, a delay lock loop for receiving the first clock signal for synchronizing the delay lock loop and a phase detector, a driver device for receiving a second clock signal derived from the first clock signal for controlling the driver device and a plurality of drivers for driving output signals, the plurality of drivers receiving a third clock signal derived from the second clock signal of the driver device. A mimic driver is included for receiving the third clock signal and coupled to the driver device. A logic interface circuit is electrically coupled to the mimic driver wherein the logic interface and the mimic driver derive a fourth clock signal from the third clock signal. A second receiver is provided for receiving the fourth signal. A package delay circuit is included for receiving an output from the second receiver and outputting a fifth clock signal derived from the fourth clock signal, the package delay circuit being electrically coupled to the phase detector. The mimic driver, the logic interface, the second receiver and the package delay circuit form a feedback loop for synchronizing the output signals from the plurality of drivers and the system clock signal.

In alternate embodiments, the mimic driver preferably includes driver transistors and the transistors may be reduced in size by about 1/50 to conserve power. The logic interface may include passive RC devices, the passive RC devices having their magnitude increased by about 50 to achieve an appropriate output voltage from the logic interface circuit. The interface logic circuit may output the fourth clock signal which may be delayed in accordance with on chip circuitry. The interface logic circuit may also include SSTL interface logic. The package delay circuit may output the fifth clock signal which may be delayed in accordance with package delays. The package delay circuit may include an inverter chain to provide delay. The package delay circuit may include adjustable delay elements wherein adjustment is provided by trimmable fuses to provide an appropriate delay. The trimmable fuses may provide delay adjustment in at least 100 ps increments.

Another delay lock loop circuit includes a receiver for receiving a system clock signal and outputting a first clock signal derived from the system clock signal, a delay lock loop for receiving the first clock signal, the first clock signal for synchronizing the delay lock loop and a phase detector, an off chip driver circuit for receiving the first clock signal and outputting data in accordance with a second clock signal derived from the first clock signal and a feedback loop coupling the off chip driver circuit to the phase detector; the feedback loop including an oil chip delay circuit including stub series termination logic for modeling on chip delay and a package delay circuit for modeling chip package delay, the feedback loop providing synchronization between the system clock signal and the data output from the off chip driver circuit. The off chip driver circuit provides a mimic off chip driver coupled to the on chip delay circuit to form the feedback loop, the mimic off chip driver and the on chip delay circuit being scaled by a scaling factor to adjust an output signal from the on chip delay circuit.

In alternate embodiments, the mimic off chip driver may include components reduced by the scaling factor and the on chip delay circuit includes components increased by the scaling factor. The scaling factor is preferably about 50. The on chip delay circuit may include passive RC devices, the passive RC devices having their magnitude increased by the scaling factor, and the mimic off chip driver may include transistors having their size reduced by the scaling factor. The package delay circuit may include an inverter chain to provide delay. The feedback loop may include an additional receiver to model the delay of the first receiver. The package delay circuit may include adjustable delay elements wherein adjustment is provided by trimmable fuses to provide an appropriate delay. The trimmable fuses may provide delay adjustment in at least 100 ps increments.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 8 is a plot of delay between real off chip driver signals and a mimic off chip driver signals for DQ_PC (as indicated in FIG. 2) in accordance with the present invention; and FIG. 9 is a plot of delay between real off chip driver signals and a mimic off chip driver signals for D_QT (as indicated in FIG. 2) in accordance with the present invention.

DETAILED DESCRIPTION OF PREFERRED EMBODIMENTS

This disclosure relates to semiconductor memories and more particularly, to an improved delay lock loop including feedback for synchronizing a system clock with data output lines. The present invention improves modeled delay accuracy to more closely represent delays of the "real" circuit. The invention implements the circuits which cause on-chip delay into a feedback loop of a delay lock loop (DLL). In this way, any technology and temperature delay deviation between the "real" circuit and the "modeled" circuit are avoided.

Figure 5:
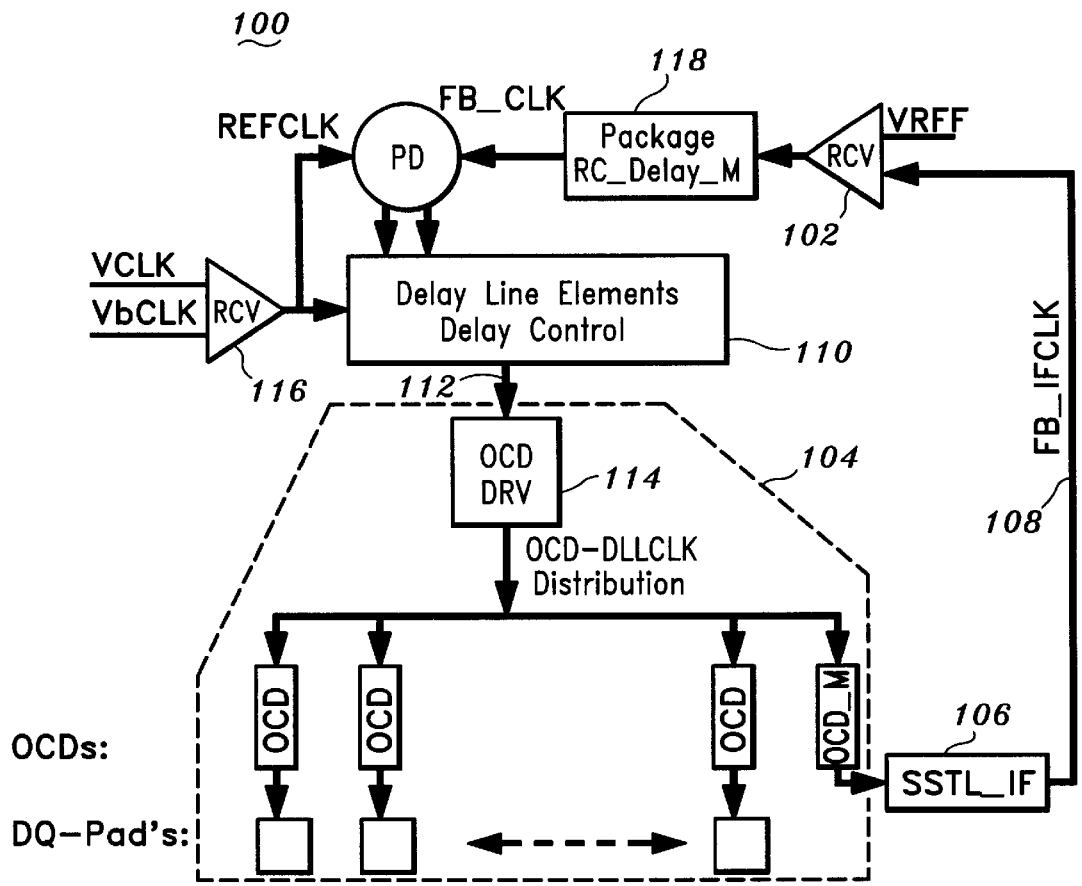
FIG. 5 is a block diagram of an improved delay lock loop circuit having a feedback loop including circuit elements with scaled sizes for improved modeling of delay in accordance with the present invention.

Referring now in specific detail to the drawings in which like reference numerals identify similar or identical elements throughout the several views, and initially to FIG. 5, an improved DLL circuit 100 is shown. DLL 100 includes a receiver 102, an off chip driver (OCD) circuit 104 and interface logic 106 or SSTL_IF, includes for example stub series termination logic (SSTL), and a package delay circuit 118 in a feed back path or loop 108. For simplicity, delay line elements, delay control and a filter as described above are represented in a single delay lock loop block labeled 110. An output 112 of DLL 110 drives an OCD driver 114. OCD driver 114 outputs an OCD DLLCLK and distributes the OCD DLLCLK signal to a plurality of DQ-Pads through OCDs as shown in FIG. 5.

Figure 1:
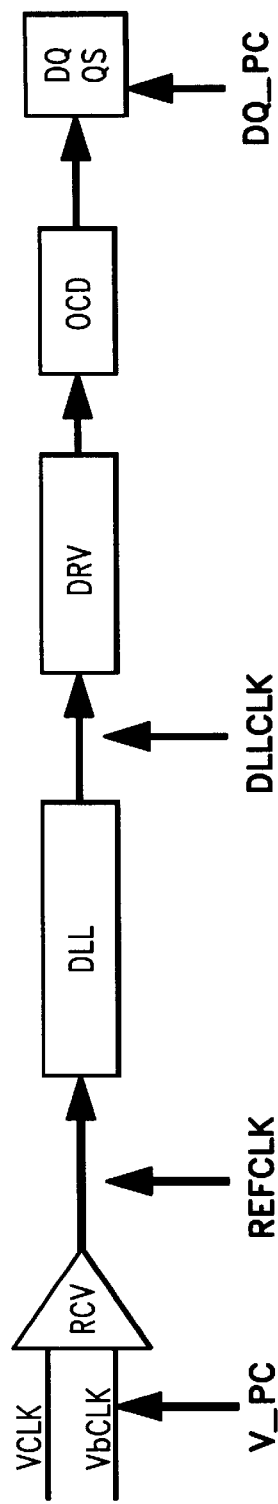
FIG. 1 is a block diagram of a chip level clock path for a dynamic random access memory in accordance with the prior art.
Figure 2:
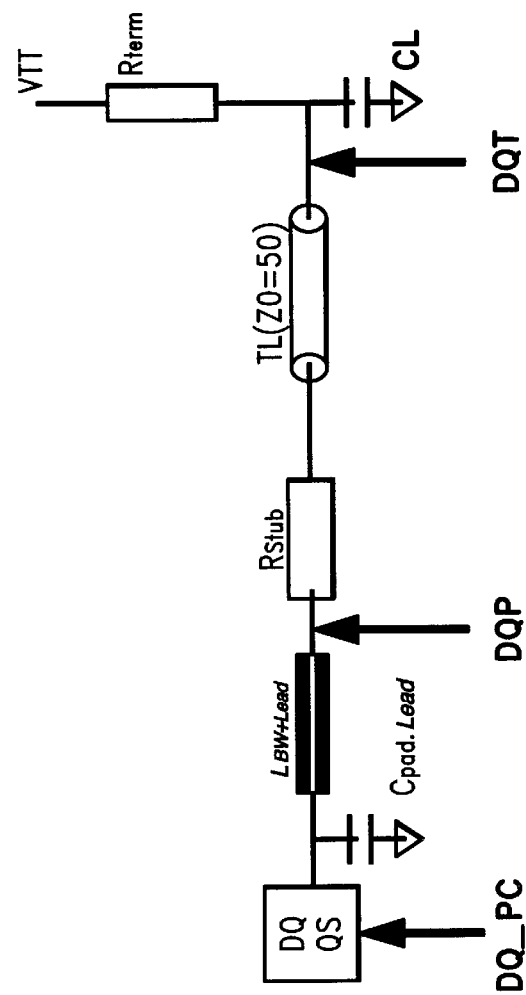
FIG. 2 is a block diagram of a module/board level clock path for a dynamic random access memory in accordance with the prior art.
Figure 3:
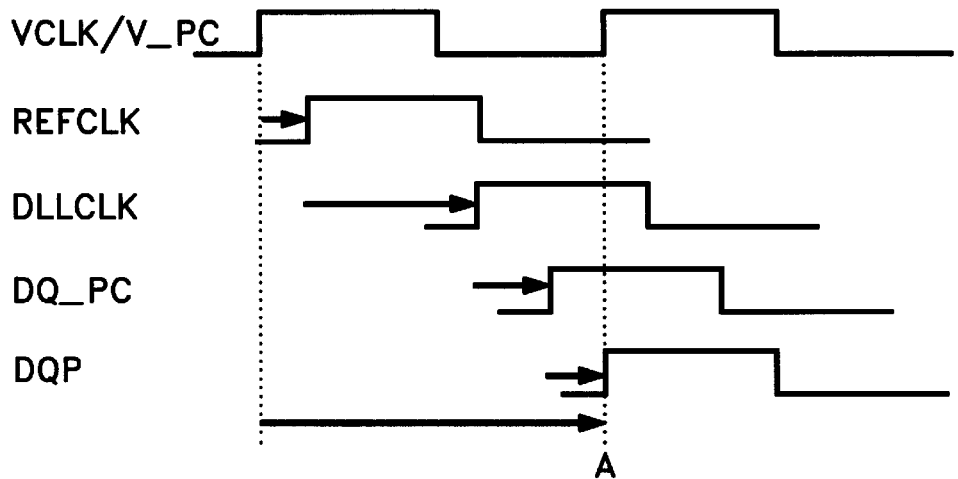
FIG. 3 is a timing diagram showing a timing budget for desired clock synchronization.
Figure 4:
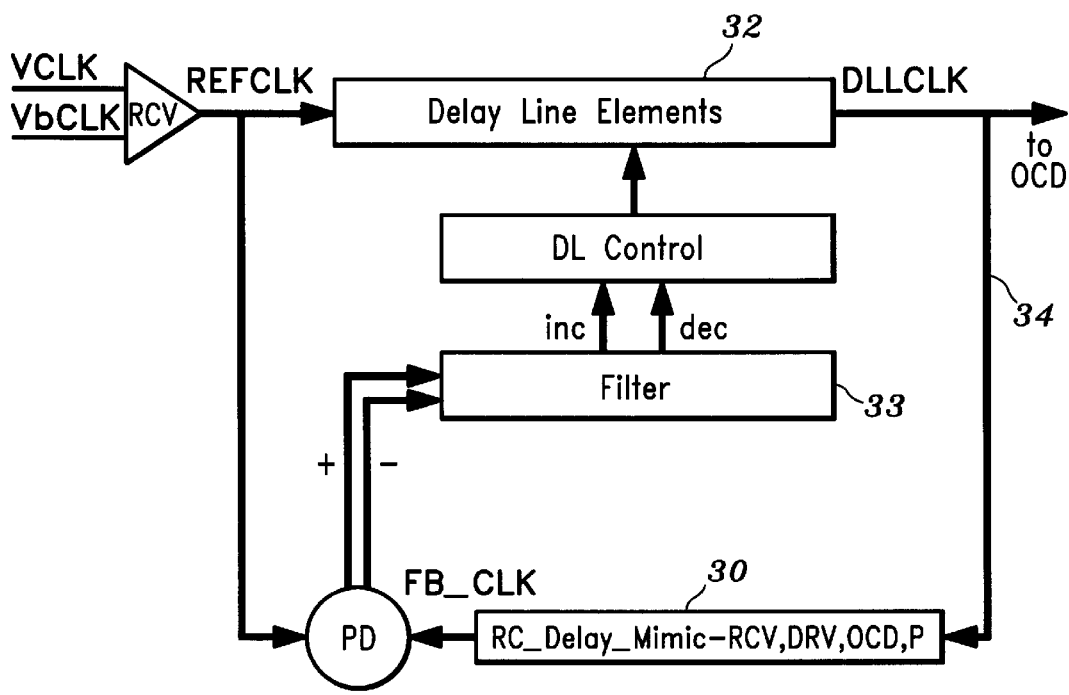
FIG. 4 is a block diagram of a conventional delay lock loop circuit showing a mimic delay circuit in accordance with the prior art.

An off chip driver OCD_M does not connect to a DQ-pad. Instead, OCD_M's output drives interface logic 106. In a preferred embodiment, the interface logic includes an SSTL interface logic block 107 (see FIG. 6). Interface logic 106 generates a voltage level, for example, an SSTL voltage level, labeled feedback interface clock FB_IFCLK. FB_IFCLK is input to receiver 102. Receiver 102 is the same or similar to a system clock receiver 116. Receiver 102 has a reference voltage VREF as well as FB_IFCLK input thereto. system clock receiver 116, as described above with reference to FIGS. 1 and 4, receives VCLK and VbCLK and generates an amplified and delayed version of VCLK named REFCLK which is to be synchronized by a phase detector PD and DLL 110.

Receiver 102 outputs to a package delay circuit or RC_delay_M 118. Delay circuit 118 is included in feedback loop 108. Delay circuit 118 may be an RC delay element and/or a delay inverter chain to mimic inductance, capacitance and resistance (LRC) components of packaging as shown in FIG. 6.

Figure 6:
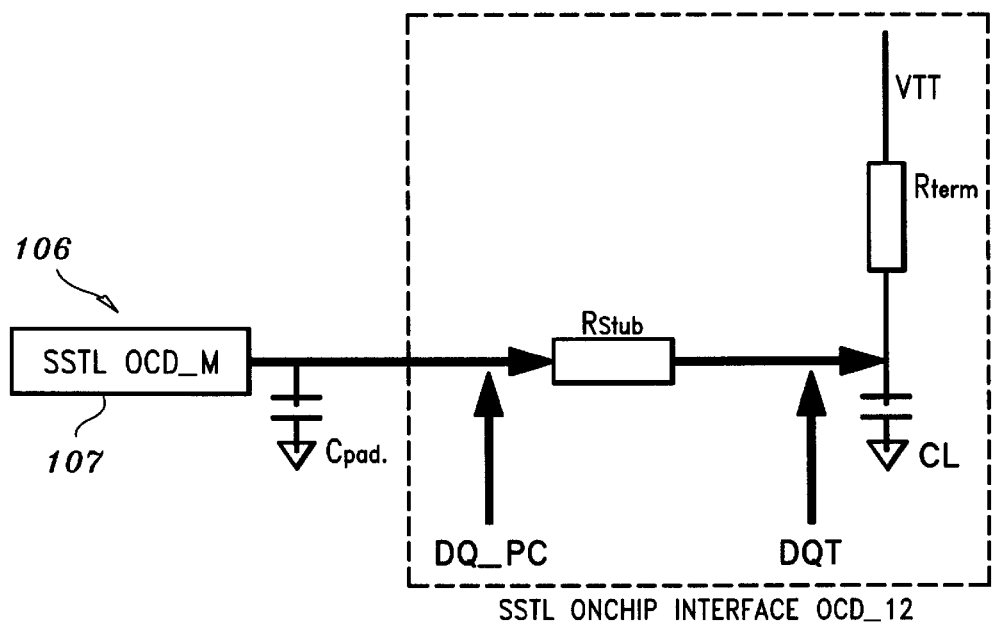
FIG. 6 is a block diagram showing an on chip to logic interface in greater detail in accordance with the present invention.

Referring to FIGS. 5 and 6, in a preferred embodiment of the present invention, the OCD circuit 104 including OCD driver 114 and OCDs in feed back path 108, and logic interface 106 are sized differently from the conventional circuits described above for FIGS. 1–4. To conserve power OCD driver 114, which includes driving transistors, has the driving transistors reduced in size, preferably about 1/50 of the conventional driver's size. Package or interface devices such as Cpad, Rstub, CL and Rterm are increased by the same order of magnitude to achieve an appropriate voltage level output from logic interface 106. Vterm voltage is generated by an on-chip voltage generator as is known in the art. One important aspect of the present invention is that OCD_M and on chip interface logic circuit 106 are scaled in their respective device sizes relative to the conventional circuits. The scaling factor for both circuits is preferably the same, however, the OCD_M circuit has its device scaled down while the on chip interface logic circuit 106 has its devices scaled up by the same factor. The scaling factor is for example about 50 although other the scaling factors are contemplated in accordance with the present invention depending on the power consumption specifications of a circuit design.

With continued reference to FIG. 6, an on-chip interface logic circuit 106 is shown. Interface logic circuit 106 preferably includes SSTL logic. An SSTL circuit provides a voltage level which characteristically behaves like the module/board since adjustments are included as described in the previous paragraph to the interface devices. SSTL circuit is driven by OCD_M. Also, the receiver and OCD circuits match the "real" circuits except for any adjustment to the OCD driver as described in the previous paragraph. The layout of the present invention advantageously places an OCD_M (mimic) circuit next to the other OCDs to share the same clock distribution tree OCD-DLLCLK with the other OCDs. The OCD_M circuit also advantageously uses the same supply voltages (i.e., VDDQ, VSSQ) as the OCDs and are therefore exposed to the same noise environment.

Figure 7:
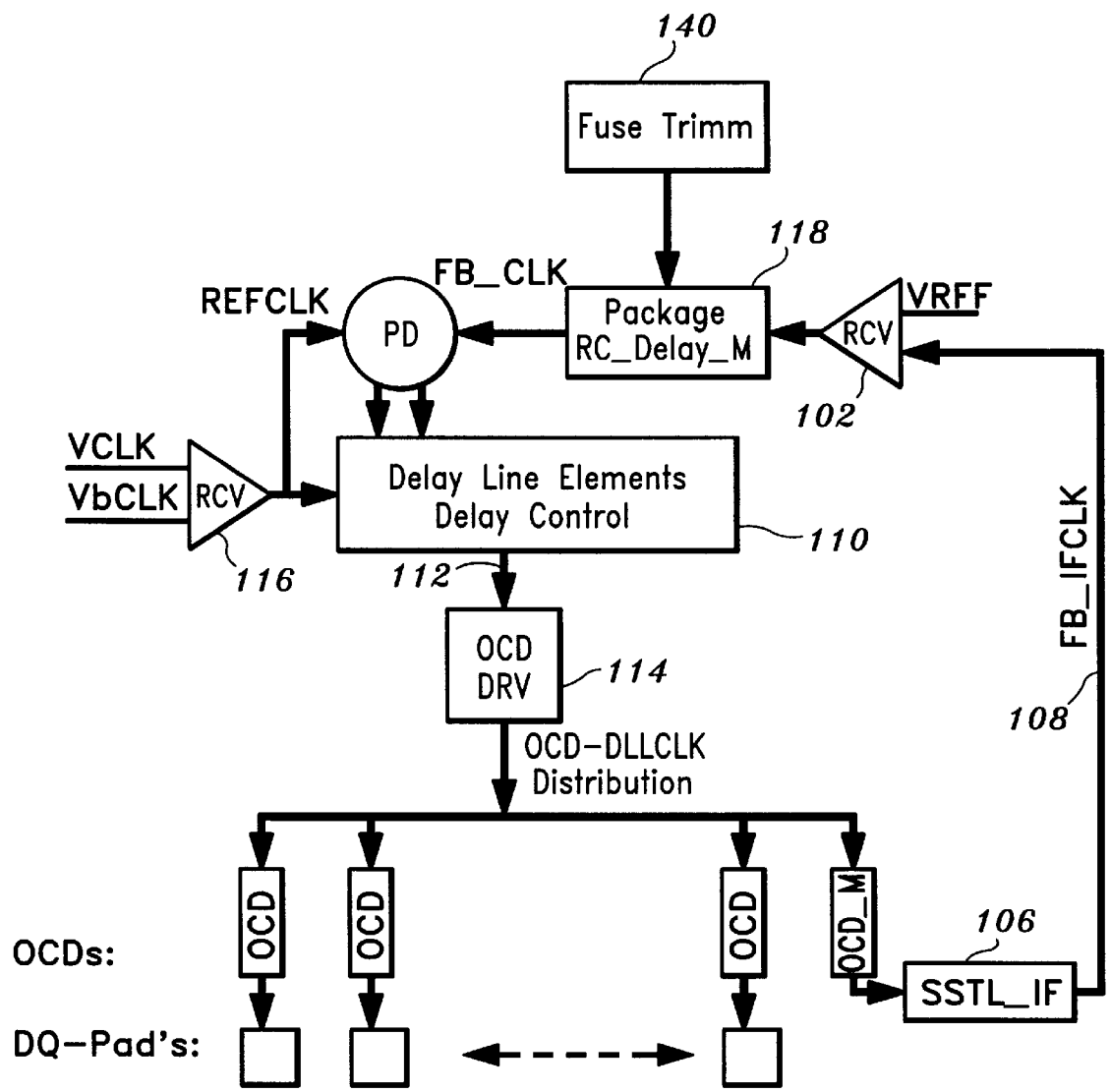
FIG. 7 is a block diagram of the improved delay lock loop circuit of FIG. 5 having trimmable fuse delay elements in accordance with the present invention.

Referring to FIG. 7, in modeling of the package delay, the inductance, of the bondwire and leadframe together with pad capacitance form an LC component which may be difficult to mimic with the RC elements or delay elements available on the chip, such as resistors or MOS capacitance, etc. In one embodiment of the present invention, a set of fuse trimmable delay elements are included in block 140. Block 140 includes trimmable fuses which preferably provide delay accuracy of about ±1 ns with an adjustment off about 100 ps steps. In this way, fuses are trimmed to achieve a desired delay based on measurements at the module/board level. A calculated fuse value is adjusted to the timing delay of the LC elements for the package delay based on these measurements.

Referring to FIGS. 8 and 9, all HSPICE simulation of the OCDs (represented herein as OCD_R (real)) is provided with an SSTL-Interface at the module level (See FIG. 6) in comparison to a chip SSTL-interface with a reduced OCD driver size circuit (OCD_M) in accordance with the present invention. TABLE 1 shows the parameters used to generate the simulation.

TABLE 1

|  | OCD/Module Interface OCD_R | OCD_M/On-Chip Interface OCD_M |
| --- | --- | --- |
| Driver | original size | × 1/50 |
| Rstub | 20 Ohms | × 50 |
| Rterm | 50 Ohms | × 50 |
| Vterm or VTT | 1.1 V | 1.1 V |

The signals are compared at DQ_PC (FIG. 8) and D_QT (FIG. 9) for OCD_R and OCD_M which are indicated in FIGS. 8 and 9. Locations for DQ_PC (FIG. 8) and D_QT (FIG. 9) in the circuit are shown in FIG. 6. The HSPICE simulation compares the module level SSTL interface signal (OCD_R) with the scaled on chip SSTL interface signal (OCD_M) at two measurement points DQ_PC in FIG. 8 (indicated in FIG. 6) and DQT in FIG. 9 (indicated in FIG. 6) to evaluate the performance of the present invention. The output curve characteristic of the HSPICE simulation for the module interface (OCD_M) and the on-chip interface (OCD_R) are almost identical. The delay between the 2 signals at the VTT (Vterm) level is approximately 200 ps. The present invention therefore provides improved synchronization for the DQs and the system clock VCLK.

Having described preferred embodiments for a novel delay lock loop circuit for semiconductor memories (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A delay lock loop circuit for a semiconductor chip, comprising:

a receiver for receiving a system clock signal and outputting a first clock signal derived from the system clock signal;

a phase detector for receiving the first clock signal and comparing the first clock signal to a feedback clock signal;

a delay circuit coupled to the phase detector to provide a delay adjusted clock signal;

an off chip driver circuit for receiving the delay adjusted clock signal and outputting data to a plurality of output terminals in accordance with the delay adjusted clock signal derived from the first clock signal; and a feedback loop circuit coupled between the off chip driver circuit and the phase detector, the feedback loop circuit including an on-chip delay circuit for modeling on-chip delay and a package delay circuit for modeling chip package delay, the feedback loop circuit providing the feedback clock signal which is delayed by the on-chip delay circuit and the package delay circuit.

2. The delay lock loop as recited in claim 1, wherein the off chip driver circuit includes a plurality of off chip drivers which receive the delay adjusted clock signal and output the data in accordance with the delay adjusted clock signal.

3. The delay lock loop as recited in claim 2, wherein one of the plurality of off chip drivers is coupled to the feedback loop circuit.

4. The delay lock loop as recited in claim 3, wherein the one of the plurality of off chip drives includes transistors and the transistors are reduced in size by about ⅟₅₀ to conserve power.

5. The delay lock loop as recited in claim 4, wherein the on chip delay circuit includes passive RC devices, the passive RC devices having a magnitude increased by about 50 to achieve an appropriate output voltage from the on chip delay circuit.

6. The delay lock loop as recited in claim 1, wherein the on chip delay circuit includes an interface logic circuit.

7. The delay lock loop as recited in claim 6, wherein the interface logic circuit further includes a scaled stub series termination logic interface.

8. The delay lock loop as recited in claim 1, wherein the package delay circuit outputs a clock signal which is delayed with package delay.

9. The delay lock loop as recited in claim 1, wherein the package delay circuit includes an inverter chain to provide delay.

10. The delay lock loop as recited in claim 1, wherein the feedback loop circuit includes an additional receiver.

11. The delay lock loop as recited in claim 1, wherein the package delay circuit includes adjustable delay elements wherein adjustment is provided by trimmable fuses to provide a predetermined delay.

12. The delay lock loop as recited in claim 11, wherein the trimmable fuses provide delay adjustment in at least 100 ps increments.

13. A delay lock loop circuit for a semiconductor chip comprising:
    a first receiver for receiving a system clock signal and outputting a first clock signal derived from the system clock signal;
    a phase detector for receiving the first clock signal and comparing the first clock signal to a feedback clock signal;
    a delay circuit coupled to the phase detector to provide a delay adjusted clock signal;
    a phase detector for receiving the first clock signal and comparing the first clock signal to a feedback clock signal;
    a plurality of drivers for receiving the delay adjusted clock signal and for outputting data to a plurality of output terminals, the plurality of drivers receiving the delay adjusted clock signal through a clock distribution path;
    a feedback loop circuit, coupled to one of the plurality of drivers including:
        a logic interface circuit electrically coupled to said one of the plurality of drivers for providing on-chip delays;
        a second receiver coupled to the logic interface circuit; and
        a package delay circuit coupled to the second receiver for providing a package delay to the feedback clock signal.

14. The delay lock loop as recited in claim 13, wherein the one of said plurality of drivers includes driver transistors and the transistors are reduced in size by about ⅟₅₀ to conserve power.

15. The delay lock loop as recited in claim 14, wherein the logic interface includes passive RC devices, the passive RC devices having a magnitude increased by about 50 to achieve an output voltage for the logic interface circuit.

16. The delay lock loop as recited in claim 13, wherein the interface logic circuit outputs a clock signal which is delayed with on chip circuitry.

17. The delay lock loop as recited in claim 13, wherein the interface logic circuit includes a scaled stub series termination logic interface.

18. The delay lock loop as recited in claim 13, wherein the package delay circuit provides delay due to bondwire and leadframe delays.

19. The delay lock loop as recited in claim 13, wherein the package delay circuit includes an inverter chain to provide delay.

20. The delay lock loop as recited in claim 13, wherein the package delay circuit includes adjustable delay elements wherein adjustment is provided by trimmable fuses to provide a predetermined delay.

21. The delay lock loop as recited in claim 20, wherein the trimmable fuses provide delay adjustment in at least 100 ps increments.

22. A delay lock loop circuit for semiconductor chips comprising:
    a receiver for receiving a system clock signal and outputting a first clock signal derived from the system clock signal;
    a phase detector for receiving the first clock signal and comparing the first clock signal to a feedback clock signal;
    a delay circuit coupled to the phase detector to provide a delay adjusted clock signal;
    an off chip driver circuit for receiving the delay adjusted clock signal and outputting data to a plurality of output terminals in accordance with the delay adjusted clock signal derived from the first clock signal; and
    a feedback loop circuit coupled between the off chip driver circuit and the phase detector, the feedback loop circuit including an on-chip delay circuit for modeling on-chip delay and a package delay circuit for modeling chip package delay, the feedback loop circuit providing the feedback clock signal which is delayed by the on-chip delay circuit and the package delay circuit; and
    the off chip driver circuit including an off chip driver coupled to the on chip delay circuit to form the feedback loop circuit, the off chip driver adapted for providing delay to the feedback clock signal, the off chip driver and the on chip delay circuit being scaled by a scaling factor to adjust power dissipation of the feedback loop circuit.

23. The delay lock loop as recited in claim 22, wherein the off chip driver includes components reduced by the scaling factor and the on chip delay circuit includes components increased by the scaling factor.

24. The delay lock loop as recited in claim 22, wherein the scaling factor is about 50.

25. The delay lock loop as recited in claim 22, wherein the on chip delay circuit includes passive RC devices, the passive RC devices having a magnitude. increased by the scaling factor and the off chip driver includes transistors having their size reduced by the scaling factor.

26. The delay lock loop recited in claim 22, wherein the package delay circuit includes an inverter chain to provide delay.

27. The delay lock loop as recited 22, wherein the feedback loop circuit includes an additional receiver to model the delay of the first receiver.

28. The delay lock loop as recited in claim 22, wherein the package delay circuit includes adjustable delay elements wherein adjustment is provided by trimmable fuses to provide a predetermined delay.

29. The delay lock loop as in claim 28, wherein the trimmable fuses provide delay adjustment in at least 100 ps increments.

* * * * *